US011726690B2

(12) United States Patent
Pekny

(10) Patent No.: US 11,726,690 B2
(45) Date of Patent: *Aug. 15, 2023

(54) INDEPENDENT PARALLEL PLANE ACCESS IN A MULTI-PLANE MEMORY DEVICE

(71) Applicant: Micron Technology, Inc., Boise, ID (US)

(72) Inventor: Theodore T. Pekny, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/870,605

(22) Filed: Jul. 21, 2022

(65) Prior Publication Data

US 2022/0365697 A1 Nov. 17, 2022

Related U.S. Application Data

(63) Continuation of application No. 16/946,267, filed on Jun. 12, 2020, now Pat. No. 11,429,300.

(51) Int. Cl.
*G06F 3/06* (2006.01)
(52) U.S. Cl.
CPC .......... *G06F 3/0644* (2013.01); *G06F 3/0604* (2013.01); *G06F 3/0659* (2013.01); *G06F 3/0673* (2013.01)
(58) Field of Classification Search
CPC .... G06F 3/0644; G06F 3/0604; G06F 3/0659; G06F 3/0673
See application file for complete search history.

(56) References Cited

U.S. PATENT DOCUMENTS

| 2009/0196102 | A1  | 8/2009  | Kim |
|---|---|---|---|
| 2015/0332762 | A1* | 11/2015 | Lee ..................... G11C 13/0004 365/163 |
| 2017/0011785 | A1* | 1/2017  | Berge ..................... G06F 13/16 |
| 2019/0043564 | A1* | 2/2019  | Madraswala .......... G11C 16/26 |
| 2019/0227719 | A1* | 7/2019  | Park ..................... G11C 7/1042 |
| 2019/0258404 | A1  | 8/2019  | Rajwade et al. |
| 2019/0265911 | A1* | 8/2019  | Yoo ........................ G06F 3/0679 |

(Continued)

OTHER PUBLICATIONS

International Search Report and Written Opinion for International Application No. PCT/US2021/036895, dated Aug. 27, 2021, 14 pages.

*Primary Examiner* — Ramon A. Mercado
(74) *Attorney, Agent, or Firm* — Lowenstein Sandler LLP

(57) ABSTRACT

A memory device includes a memory array comprising a first number of planes, a second number of independent plane driver circuits, wherein the second number is less than the first number, and a plane selection circuit to couple the second number of independent plane driver circuits to the first number of planes of the memory array. The memory device further includes control logic, to perform receive a first read command and identify, among the first number of planes, a first plane to which the first read command is directed. The control logic further configures the plane selection circuit to couple a first independent plane driver of the second number of independent plane drivers to the first plane and causes the first independent plane driver to perform a first read operation corresponding to the first read command on the first plane.

20 Claims, 4 Drawing Sheets

(56) References Cited

U.S. PATENT DOCUMENTS

| | | | |
|---|---|---|---|
| 2019/0278705 A1* | 9/2019 | Park | G06F 12/0246 |
| 2019/0362792 A1* | 11/2019 | Oh | H10B 43/10 |
| 2020/0026466 A1* | 1/2020 | Takano | G06F 3/061 |
| 2020/0125293 A1* | 4/2020 | Park | G06F 3/0659 |
| 2021/0271409 A1* | 9/2021 | Ben-Rubi | G06F 3/0659 |
| 2021/0329370 A1* | 10/2021 | Kim | H04R 1/2807 |
| 2021/0370381 A1* | 12/2021 | Fleischer | B21D 51/2669 |

\* cited by examiner

INDEPENDENT PARALLEL PLANE ACCESS IN A MULTI-PLANE MEMORY DEVICE

RELATED APPLICATIONS

This application is a continuation of U.S. patent application Ser. No. 16/946,267, filed Jun. 12, 2020, the entire contents of which are hereby incorporated by reference herein.

TECHNICAL FIELD

Embodiments of the disclosure relate generally to memory sub-systems, and more specifically, relate to independent parallel plane access in a multi-plane memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
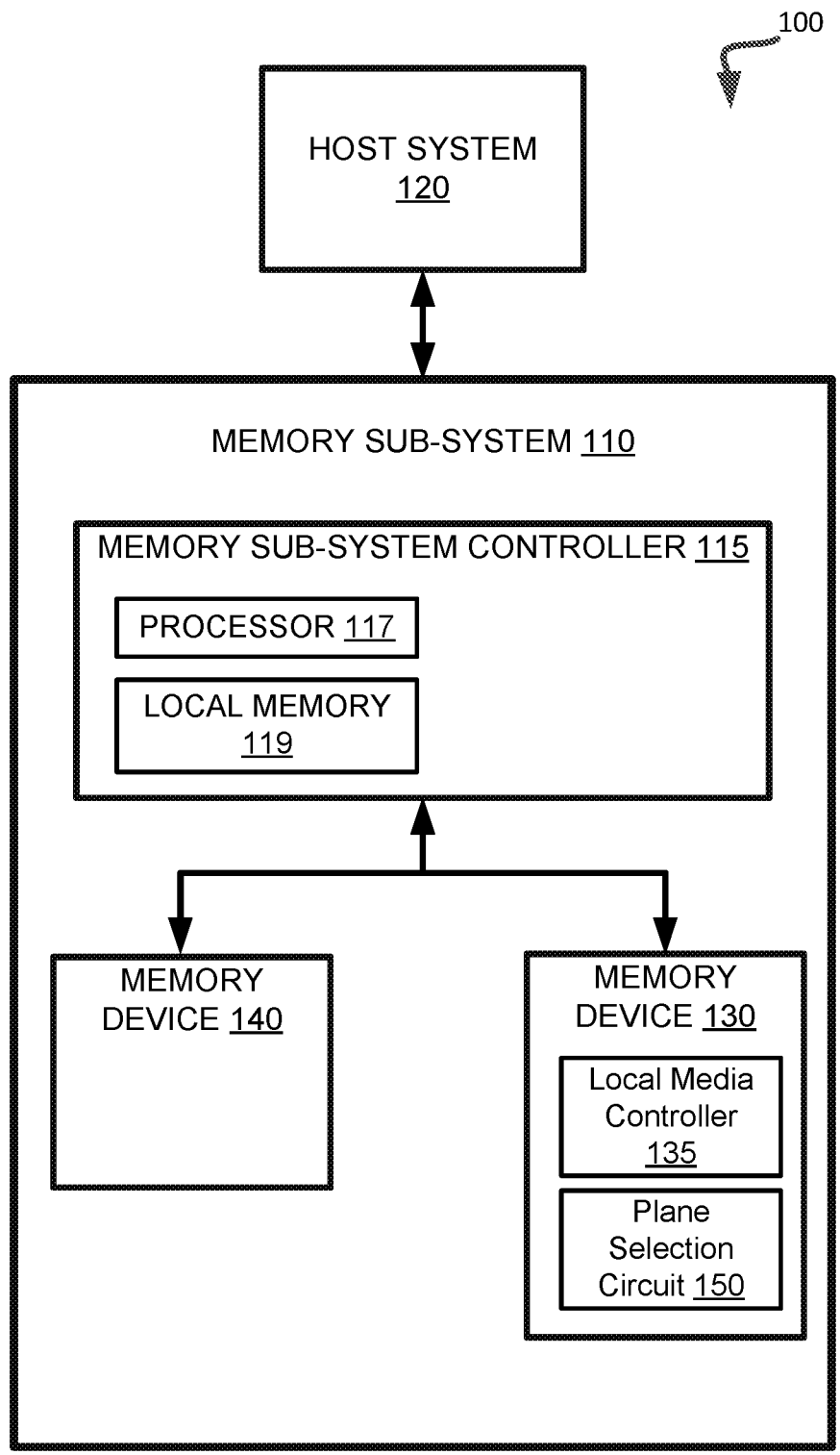
FIG. 1 illustrates an example computing system that includes a memory sub-system in accordance with some embodiments of the present disclosure.

Aspects of the present disclosure are directed to independent parallel plane access in a multi-plane memory device in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits.

In certain memory devices, there can be fewer independent plane driver circuits than there are memory planes. For example, in one situation, a memory device can have four separate memory planes, but only two independent plane driver circuits. In such a situation, the planes are often divided into multiple plane groups, each associated with a separate independent plane driver circuit. For example, the first two planes of the memory device can be part of a first plane group that is associated with a first independent plane driver circuit and the last two planes of the memory device can be part of a second plane group that is associated with a second independent plane driver circuit. The two independent plane driver circuits allow memory access operations (e.g., read operations) to be performed on multiple planes of the memory device in parallel (i.e., at least partially overlapping in time). Since the multiple planes are grouped into plane groups, where each plane group is associated with a separate independent plane driver circuit, there are restrictions on which planes can be accessed in parallel. For example, if memory access operations directed to multiple planes in the same plane group are received, they cannot be performed in parallel because there is only a single independent plane driver circuit associated with that plane group. Even though the memory device may include another independent plane driver circuit that is not being used, that independent plane driver circuit cannot be used to access the planes of the first plane group. Thus, any time a memory access operation is being performed on a given plane of the memory device, at least some other portion of the memory device is inaccessible. As a result, any subsequent memory access operations directed to a plane of the same plane group are queued and processed at a later time (e.g., once the associated independent plane driver circuit completes processing of a previous memory access operation and become available). This increases overall latency, reduces the number of read input/output operations per second (RIOPS) that can be processed by the memory device, and decreases the quality of service for the host system utilizing the memory sub-system.

Aspects of the present disclosure address the above and other deficiencies by implementing a plane selection circuit in a memory device to selectively couple any of a first number of memory planes in the memory device to any of a second number of independent plane driver circuits. The independent plane driver circuits are configured to concurrently provide signals to access blocks of the planes of the memory device during memory access operations. In one embodiment, the plane selection circuit includes a multiplexer circuit corresponding to each of the planes of the memory device. Each of the multiplexer circuits is configured to route signals from any of the independent plane driver circuits to a corresponding one of the memory planes based on a control signal received from control logic in the memory device. In this manner, the restrictions on which planes can be accessed in parallel are eliminated. Thus, if one independent plane driver circuit is configured to perform a memory access operation on a given plane, a second independent plane driver circuit can be configured to perform a memory access operation on any other plane of the memory device in parallel, without any limitations based on plane groups.

Advantages of this approach include, but are not limited to, a reduction in overall latency, an increased number of RIOPS that can be processed by the memory device, and an increase in the quality of service for the host system utilizing the memory sub-system. In contrast to adding additional independent plane driver circuits, such as one independent plane driver circuit corresponding to each plane of the memory device, the approach described herein offers a number of benefits. For example, the second number of independent plane driver circuits can be less than the first number of memory planes in the memory device in order to reduce the circuit area, the amount of noise generated, and the power utilization in the memory sub-system, while still providing the benefits described herein.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell.

Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory device 130 includes a plane selector circuit 150 that can selectively couple any of a first number of memory planes in memory device 130 to any of a second number of independent plane driver circuits in memory device 130. In one embodiment, local media controller 135 receives a first read command associated with memory device 130, such as from memory sub-system controller 115, host system 120, or some other component, and identifies a first plane of a memory array of the memory device 130 to which the first read command is directed. Local media controller 135 configures plane selection circuit 150 to couple a first independent plane driver of the memory device 130 to the first plane and causes the first independent plane driver to perform a first read operation corresponding to the first read command on the first plane. If the local media controller 135 receives a second read command while the first read operation is still being performed, local media controller 135 can determine whether the second read command is directed to the first plane (i.e., the same plane as the currently active first read operation). If the second read command is directed to the first plane, local media controller can maintain an indication of the second read command in a queue corresponding to the first plane until the first read operation is complete, and subsequently cause the first independent plane driver to perform a second read operation corresponding to the second read command on the first plane.

If, however, the second read command is not directed to the first plane, the local media controller 135 can identify a second plane of the first number of planes to which the second read command is directed. Local media controller 135 can configure the plane selection circuit 150 to couple a second independent plane driver to the second plane and cause the second independent plane driver to perform a second read operation corresponding to the second read command on the second plane. The second read operation can be performed concurrently (i.e. at least partially overlapping in time) with the first read operation. The second plane can be any of the first number of planes in memory device 130, without any limitation based on a plane group. In one embodiment, local media controller 135 tracks the statuses of the first number of planes of the memory array (i.e., whether each plane is currently being accessed or is available) and the second number of independent plane driver circuits (i.e., whether each independent plane driver circuit is currently performing a memory access operation) and routes/schedules memory access operations in the memory device 130 based on those statuses. Further details with regards to the operations of local media controller 135 and plane selection circuit 150 are described below.

In some embodiments, the memory sub-system controller 115 includes at least a portion of plane selection circuit 150. For example, the memory sub-system controller 115 can include a processor 117 (e.g., a processing device) configured to execute instructions stored in local memory 119 for performing the operations described herein. In other embodiments, memory device 130 includes local media controller 135 and at least a portion of plane selection circuit 150 and is configured to perform the functionality described herein. In such an embodiment, plane selection circuit 150 can be implemented using hardware or as firmware, stored on memory device 130, executed by the control logic (e.g., local media controller 135) to perform the operations related to independent parallel plane access described herein.

Figure 2:
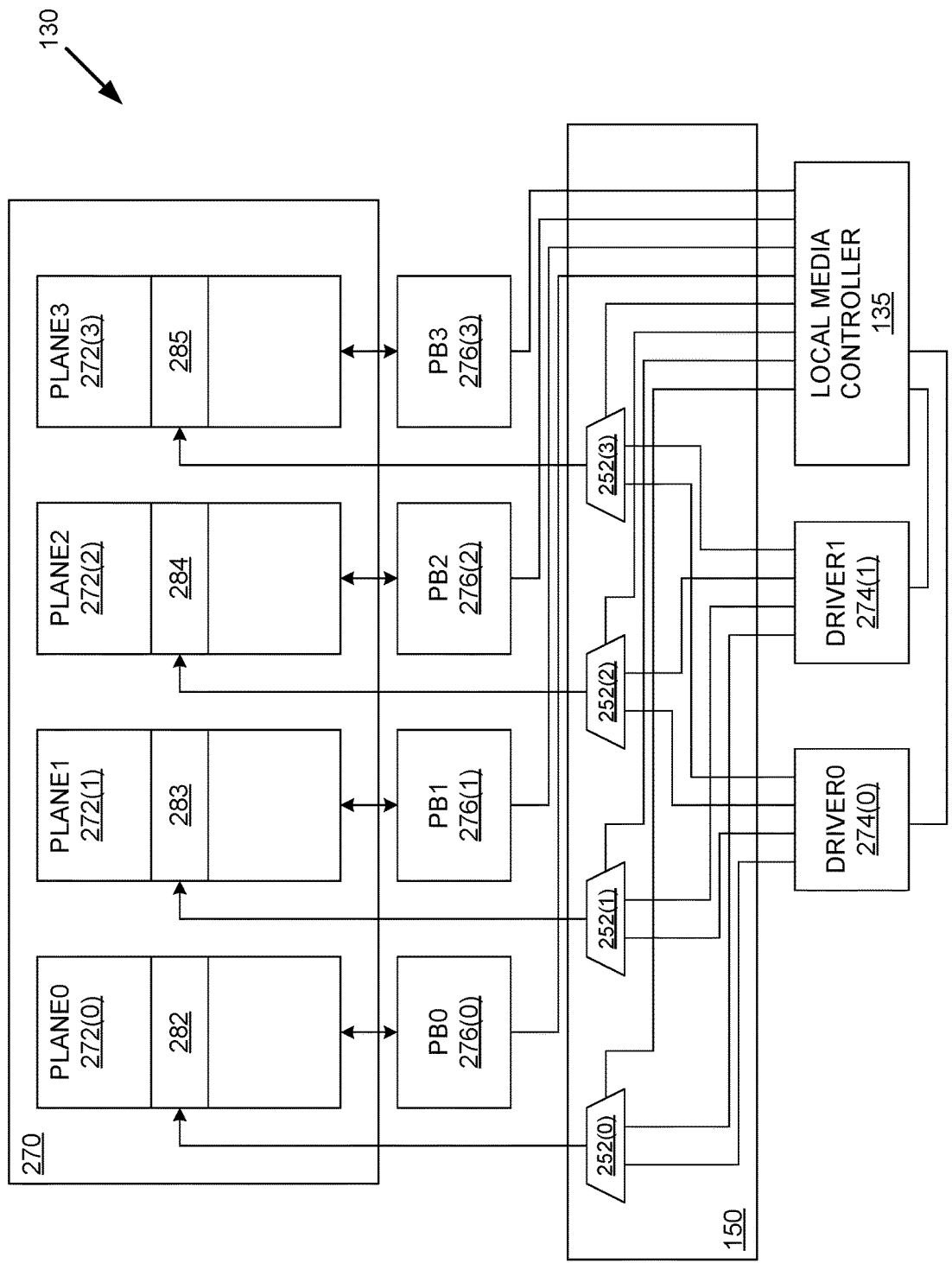
FIG. 2 is a block diagram illustrating a multi-plane memory device configured for independent parallel plane access in accordance with some embodiments of the present disclosure.

FIG. 2 is a block diagram illustrating a multi-plane memory device 130 configured for independent parallel plane access in accordance with some embodiments of the present disclosure. The memory device 130 includes a memory array 270 divided into memory planes 272(0)-272(3) that each includes a respective number of memory cells. The multi-plane memory device 130 can further include local media controller 135, including a power control circuit and access control circuit for concurrently performing memory access operations for different memory planes 272(0)-272(3). The memory cells can be non-volatile memory cells, such as NAND flash cells, or can generally be any type of memory cells.

The memory planes 272(0)-272(3) can each be divided into blocks of data, with a different relative block of data from two or more of the memory planes 272(0)-272(3) concurrently accessible during memory access operations. For example, during memory access operations, two or more of data block 282 of the memory plane 272(0), data block 283 of the memory plane 272(1), data block 284 of the memory plane 272(2), and data block 285 of the memory plane 272(3) can each be accessed concurrently.

Each of the memory planes 272(0)-272(3) can be coupled to a respective page buffer 276(0)-276(3). Each page buffer 276(0)-276(3) can be configured to provide data to or receive data from the respective memory plane 272(0)-272(3). The page buffers 276(0)-276(3) can be controlled by local media controller 135. Data received from the respective memory plane 272(0)-272(3) can be latched at the page buffers 276(0)-276(3), respectively, and retrieved by local media controller 135, and provided to the memory sub-system controller 115 via the NVMe interface.

Each of the memory planes 272(0)-272(3) can be further coupled to one of a number of independent plane driver circuits 274(0)-274(1), such as an access line driver circuit. The driver circuits 274(0)-274(1) can be configured to condition a page of a respective block of one of memory planes 272(0)-272(3) for a memory access operation, such as programming data (i.e., writing data), reading data, or erasing data. Each of the driver circuits 274(0)-274(1) can be coupled, via plane selection circuit 150, to global access lines associated with any of memory planes 272(0)-272(3) in memory array 270. Plane selection circuit 150 can selectively couple each of the global access lines to respective local access lines within a block of a plane during a memory access operation associated with a page within the block. The driver circuits 274(0)-274(1) can be controlled based on signals from local media controller 135. Each of the driver circuits 274(0)-274(1) can include or be coupled to a respective power circuit, and can provide voltages to respective access lines based on voltages provided by the respective power circuit. The voltages provided by the power circuits can be based on signals received from local media controller 135. In the embodiment illustrated in FIG. 2, memory device 130 includes four planes 272(0)-272(3) and two independent plane driver circuits 274(0)-274(1). In should be appreciated that in other embodiments, memory device 130 can include some other number of planes and some other number of independent plane driver circuits, where the number of independent plane driver circuits is generally less than the number of planes.

The local media controller 135 can control the driver circuits 274(0)-274(1) and page buffers 276(0)-276(3) to concurrently perform memory access operations associated with each of a group of memory command and address pairs (e.g., received from memory sub-system controller 115). For example, local media controller 135 can control the driver circuits 274(0)-274(1) and page buffer 376(0)-376(3) to perform the concurrent memory access operations. Local media controller 135 can include a power control circuit that serially configures two or more of the driver circuits 274(0)-274(1) for the concurrent memory access operations, and an access control circuit configured to control two or more of the page buffers 276(0)-276(3) to sense and latch data from the respective memory planes 272(0)-272(3), or program data to the respective memory planes 272(0)-272(3) to perform the concurrent memory access operations.

In operation, local media controller 135 can receive a group of memory command and address pairs via the NVMe bus, with each pair arriving in parallel or serially. In some examples, the group of memory command and address pairs can each be associated with different respective memory planes 272(0)-272(3) of the memory array 270. The local media controller 135 can be configured to perform concurrent memory access operations (e.g., read operations or program operations) for two or more different memory planes 272(0)-272(3) of the memory array 270 responsive to the group of memory command and address pairs. For example, the power control circuit of local media controller 135 can serially configure, for the concurrent memory access operations based on respective page type (e.g., UP, MP, LP, XP, SLC/MLC/TLC/QLC page), the driver circuits 274(0)-274(1) for two or more memory planes 272(0)-272(3) associated with the group of memory command and address pairs. After the access line driver circuits 274(0)-274(1) have been configured, the access control circuit of local media controller 135 can concurrently control the page buffers 276(0)-276(3) to access the respective pages of each of the two or more memory planes 272(0)-272(3) associated with the group of memory command and address pairs, such as retrieving data or writing data, during the concurrent memory access operations. For example, the access control circuit can concurrently (e.g., in parallel and/or contemporaneously) control the page buffers 276(0)-276(3) to charge/discharge bitlines, sense data from the two or more memory planes 272(0)-272(3), and/or latch the data.

Based on the signals received from local media controller 135, the driver circuits 274(0)-274(1) that are coupled to the memory planes 272(0)-272(3) associated with the group of memory command and address command pairs can select blocks of memory or memory cells from the associated memory plane 272(0)-272(3), for memory operations, such as read, program, and/or erase operations. The driver circuits 274(0)-274(1) can drive different respective global access lines associated with a respective memory plane 272(0)-272(3). As an example, the driver circuit 274(0) can drive a first voltage on a first global access line associated with the memory plane 272(0), the driver circuit 274(1) can drive a second voltage on a third global access line associated with the memory plane 272(1), the driver circuit 274(2) can drive a third voltage on a seventh global access line associated with the memory plane 272(2), etc., and other voltages can be driven on each of the remaining global access lines. In some examples, pass voltages can be provided on all access lines except an access line associated with a page of a memory plane 272(0)-272(3) to be accessed. The local media controller 135, the driver circuits 274(0)-274(1) can allow different respective pages, and the page buffers 276(0)-276(3) within different respective blocks of memory cells, to be accessed concurrently. For example, a first page of a first block of a first memory plane can be accessed concurrently with a second page of a second block of a second memory plane, regardless of page type.

The page buffers 276(0)-276(3) can provide data to or receive data from the local media controller 135 during the memory access operations responsive to signals from the local media controller 135 and the respective memory planes 272(0)-272(3). The local media controller 135 can provide the received data to memory sub-system controller 115.

It will be appreciated that the memory device 130 can include more or less than four memory planes, driver circuits, and page buffers. It will also be appreciated that the respective global access lines can include 8, 16, 32, 64, 128, etc., global access lines. The plane selection circuit 150 enables the local media controller 135 and the driver circuits 274(0)-274(1) to concurrently access different respective pages within different respective blocks of any two of memory planes 272(0)-272(3) concurrently. In one embodiment, plane selection circuit 150 includes a number of bi-directional multiplexer circuits 252(0)-252(3), each corresponding to one of memory planes 272(0)-272(3). Each of bi-directional multiplexer circuits 252(0)-252(3) can be a N:1 multiplexer, where N represents the number of independent plane driver circuits 274(0)-274(1) in memory device 130. The bi-directional multiplexer circuits 252(0)-252(3) are controlled by control signals received from local media controller 135 to selectively couple either of independent plane driver circuits 274(0)-274(1) to corresponding ones of memory planes 272(0)-272(3). For example, depending on the control signals, multiplexer circuit 252(0) can couple either of independent plane driver circuits 274(0)-274(1) to memory plane 272(0). Similarly, depending on the control signals, multiplexer circuit 252(1) can couple either of independent plane driver circuits 274(0)-274(1) to memory plane 272(1), multiplexer circuit 252(2) can couple either of independent plane driver circuits 274(0)-274(1) to memory plane 272(2), or multiplexer circuit 252(3) can couple either of independent plane driver circuits 274(0)-274(1) to memory plane 272(3). Thus, plane selection circuit 150 can couple both of independent plane driver circuits 274(0)-274(1) to any two of memory planes 272(0)-272(3) concurrently, thereby allowing local media controller 135 to perform concurrent memory access operations. Any received read command can include an associated address of the plane/block/page of memory device 130 to be read, so the location of the data is fixed. The data from the fixed location can be read, however, using either of independent plane driver circuits 274(0)-274(1), depending on which is available.

Figure 3:
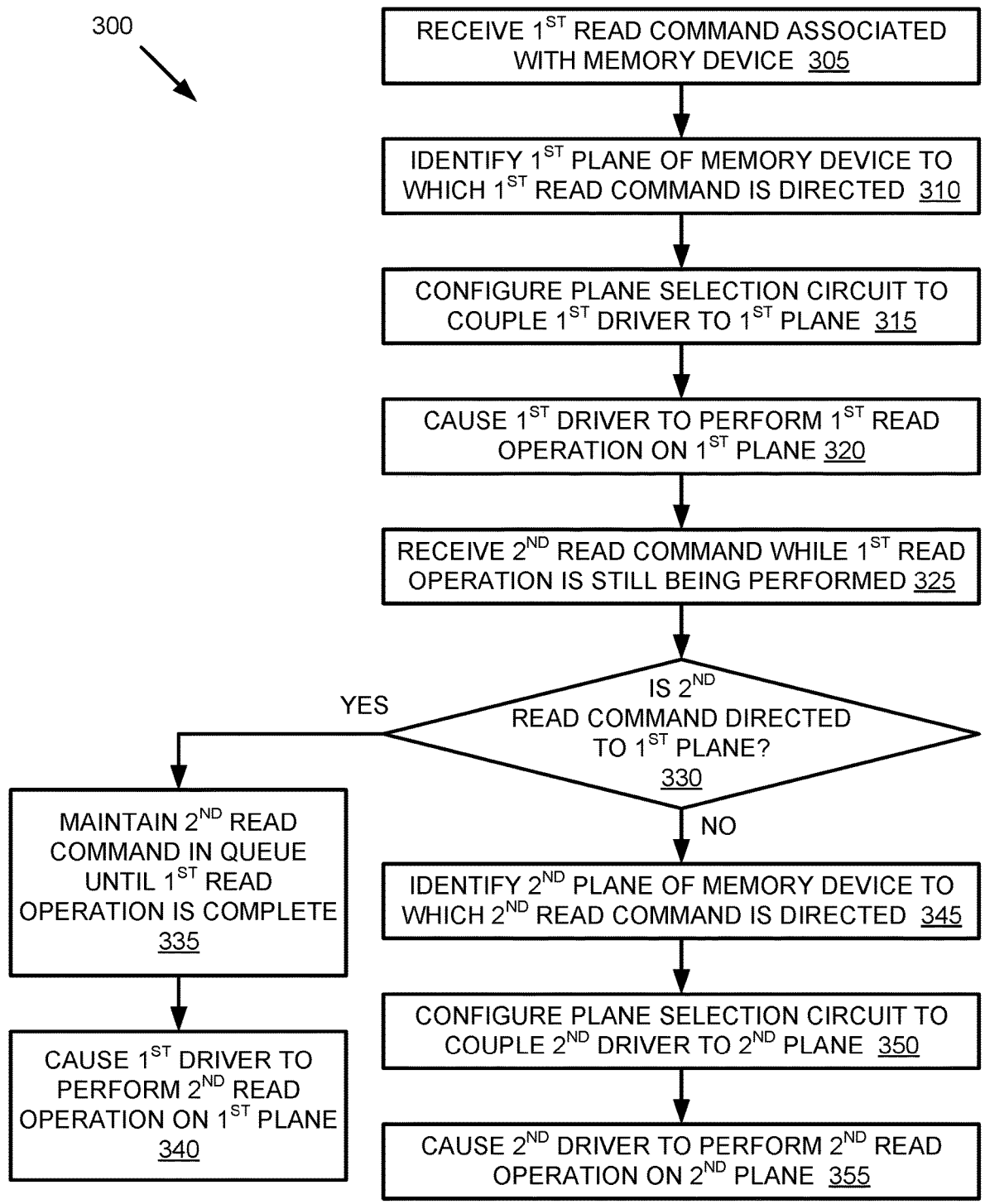
FIG. 3 is a flow diagram of an example method of independent parallel plane access in a multi-plane memory device in a memory sub-system in accordance with some embodiments of the present disclosure.

FIG. 3 is a flow diagram of an example method of independent parallel plane access in a multi-plane memory device in a memory sub-system in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by local media controller 135 and plane selection circuit 150 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, a memory access command is received. For example, processing logic (e.g., local media controller 135) can receive a first memory access command directed to a memory device, such as memory device 130. In one embodiment, the first memory access command is a read command, which can be received from a controller, such as memory sub-system controller 115, some other component of memory sub-system 110, or from an external component, such as host system 120. In one embodiment, the read command specifies at least one of a logical or physical address associated with data to be read from memory device 130.

At operation 310, a corresponding plane of a memory device is identified. For example, the processing logic can identify a first plane of a first number of planes, such as memory planes 272(0)-272(3), of a memory array 270 of the memory device to which the read command is directed. In one embodiment, the processing logic identifies the first plane as the one of memory planes 272(0)-272(3) storing a block of data corresponding to the logical or physical address included in the received read command. For example, local media controller 135 can maintain a mapping of memory addresses to each of the memory planes 272(0)-272(3). In one embodiment, the first memory plane can be any of memory planes 272(0)-272(3), and is not necessarily limited to memory plane 272(0).

At operation 315, a plane selection circuit is configured. For example, the processing logic can configure plane selection circuit 150 to couple a first independent plane driver, such as driver 274(0), of a second number of independent plane drivers of memory device 130 to the first plane identified at operation 310. In one embodiment, memory device includes independent plane drivers 274(0)-274(1) which are configured to currently provide signals to access blocks of memory planes 272(0)-272(3) during memory access operations. In one embodiment, the plane selection circuit 150 includes a first number of multiplexer circuits 252(0)-252(3), each corresponding to one of the first number of planes 272(0)-272(3). Each multiplexer circuit 252(0)-252(3) is configured to route signals from any of the independent plane driver circuits 274(0)-274(1) to the corresponding one of the memory planes 272(0)-272(3) based on a control signal received from the control logic (e.g., local media controller 135). Thus, to configure the plane selection circuit 150, the processing logic can send a control signal to one of multiplexer circuits 252(0)-252(3) corresponding to the first plane identified at operation 310 to cause the multiplexer circuit to couple a selected one of independent plane drivers 274(0)-274(1) to the identified plane. In one embodiment, the first independent plane driver can be any of drivers 274(0)-274(1), and is not necessarily limited to driver 274(0). In one embodiment, any available one of drivers 274(0)-274(1) can be selected as the first driver independent plane driver. In order to identify an available driver, the processing logic can track statuses (e.g., ready/busy statuses) of the drivers 274(0)-274(1), as well as of the memory planes 272(0)-272(3) and can route memory access operations based on those statuses. If more than one of drivers 274(0)-274(1) is available, the processing logic can select a default driver to use as the first driver, or can select a driver to use as the first driver according to some selection algorithm (e.g., round robin).

At operation 320, a memory access operation is performed. For example, the processing logic can cause the first independent plane driver to perform a first read operation corresponding to the first read command on the first plane. In one embodiment, the processing logic can apply a signal to the selected one of independent plane drivers 274(0)-274(1) to cause the driver to provide signals to access blocks of the identified one of planes 272(0)-272(3) corresponding to the address included in the received memory access command. The signals read the levels of charge stored at the memory cells of the accessed blocks, which can be interpreted as data values. The processing logic can return those data values to the component that issued the memory access command as a response.

At operation 325, a memory access command is received. For example, the processing logic can receive a second memory access command directed to memory device 130. In one embodiment, the second memory access command is a read command, which can be received from a controller, such as memory sub-system controller 115, some other component of memory sub-system 110, or from an external component, such as host system 120. In one embodiment, the read command specifies at least one of a logical or physical address associated with data to be read from memory device 130. In one embodiment, the second memory access command is received concurrently with the first memory access command, such that the second memory access command is received before the first read operation is performed or while the first read operation is still being performed at operation 320.

At operation 330, a determination is made. For example, the processing logic can determine whether the second read command is directed to the first plane (i.e., the same plane to which the first read command is directed. If the second read command is not directed to the first plane (i.e., the second read command is directed to a different one of planes 272(0)-272(3), the processing logic proceeds to operation 335. If, however, the second read command is directed to the first plane, the processing logic proceeds to operation 345.

At operation 335, a memory access command is queued. For example, the processing logic can maintain an indication of the second read command in a queue corresponding to the first plane until the first read operation is complete. In one embodiment, each of planes 272(0)-272(3) has an associated queue (e.g., a buffer, FIFO, etc.) where commands/operations can be stored. Since only one operation can be performed on a given plane at a time, any additional operations can be stored in the associated queue until a previous command has been completed.

At operation 340, a memory access operation is performed. For example, the processing logic can cause the first independent plane driver to perform a second read operation corresponding to the second read command on the first plane. In one embodiment, the processing logic can apply a signal to the selected one of independent plane drivers 274(0)-274(1) to cause the driver to provide signals to access blocks of the identified one of planes 272(0)-272(3) corresponding to the address included in the received memory access command. The signals read the levels of charge stored at the memory cells of the accessed blocks, which can be interpreted as data values. The processing logic can return those data values to the component that issued the memory access command as a response.

At operation 345, a corresponding plane of a memory device is identified. For example, the processing logic can identify a second plane of the first number of planes, such as memory planes 272(0)-272(3) to which the read command is directed. In one embodiment, the processing logic identifies the second plane as the one of memory planes 272(0)-272(3) storing a block of data corresponding to the logical or physical address included in the received read command. For example, local media controller 135 can maintain a mapping of memory addresses to each of the memory planes 272(0)-272(3). In one embodiment, the second memory plane can be any of memory planes 272(0)-272(3), and is not necessarily limited to memory plane 272(1).

At operation 350, a plane selection circuit is configured. For example, the processing logic can configure plane selection circuit 150 to couple a second independent plane driver, such as driver 274(1) to the second plane identified at operation 345. To configure the plane selection circuit 150, the processing logic can send a control signal to one of multiplexer circuits 252(0)-252(3) corresponding to the second plane identified at operation 345 to cause the multiplexer circuit to couple a selected one of independent plane drivers 274(0)-274(1) to the identified plane. In one embodiment, the second independent plane driver can be any of drivers 274(0)-274(1), and is not necessarily limited to driver 274(1). In one embodiment, any available one of drivers 274(0)-274(1) can be selected as the second driver independent plane driver. If for example, driver 274(0) is currently in use, the processing logic can select driver 274(1).

At operation 355, a memory access operation is performed. For example, the processing logic can cause the second independent plane driver to perform a second read operation corresponding to the second read command on the second plane. In one embodiment, the processing logic can apply a signal to the selected one of independent plane drivers 274(0)-274(1) to cause the driver to provide signals to access blocks of the identified one of planes 272(0)-272(3) corresponding to the address included in the received memory access command. The signals read the levels of charge stored at the memory cells of the accessed blocks, which can be interpreted as data values. The processing logic can return those data values to the component that issued the memory access command as a response.

Figure 4:
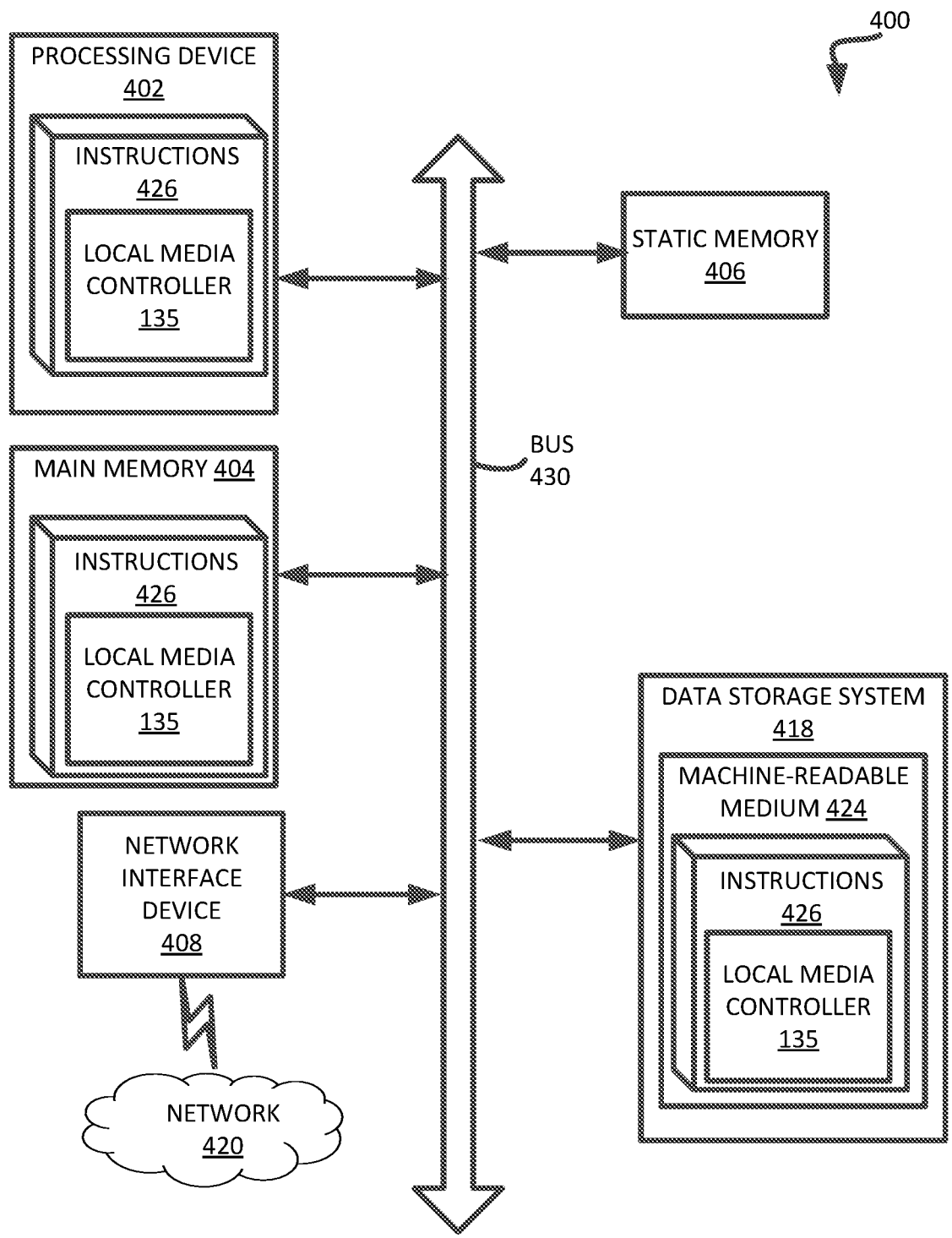
FIG. 4 is a block diagram of an example computer system in which embodiments of the present disclosure can operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium, such as a non-transitory computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to local media controller 135 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising a first number of planes;
a second number of independent plane driver circuits, wherein the second number is less than the first number;
a plane selection circuit to couple the second number of independent plane driver circuits to the first number of planes of the memory array; and
control logic, operatively coupled with the memory array, the second number of independent plane driver circuits, and the plane selection circuit, the control logic to perform operations comprising:
 receiving a first memory command;
 configuring the plane selection circuit to couple a first independent plane driver circuit of the second number of independent plane driver circuits to a first plane of the first number of planes;
 causing the first independent plane driver circuit to perform a first memory operation corresponding to the first memory command on the first plane;
 receiving a second memory command while the first memory operation is still being performed;
 determining whether the second memory command is directed to a same plane as the first memory command;
 responsive to determining that the second memory command is not directed to the same plane as the first memory command, configuring the plane selection circuit to couple a second independent plane driver circuit of the second number of independent plane driver circuits to a second plane if the first number of planes; and
 causing the second independent plane driver circuit to perform a second memory operation corresponding to the second memory command on the second plane concurrently with the first memory operation being performed on the first plane.

2. The memory device of claim 1, wherein the second number of independent plane driver circuits are configured to concurrently provide signals to access blocks of the first number of planes during memory access operations.

3. The memory device of claim 1, wherein the plane selection circuit comprises a first number of multiplexer circuits, each corresponding to one of the first number of planes.

4. The memory device of claim 3, wherein each of the first number of multiplexer circuits is configured to route signals from any of the second number of independent plane driver circuits to the corresponding one of the first number of planes based on a control signal received from the control logic.

5. The memory device of claim 1, wherein the control logic is to perform operations further comprising:
responsive to determining that the second memory command is directed to the same plane as the first memory command, maintaining an indication of the second memory command in a queue corresponding to the first plane until the first memory operation is complete.

6. The memory device of claim 5, wherein the control logic is to perform operations further comprising:
causing the first independent plane driver circuit to perform a second memory operation corresponding to the second memory command on the first plane.

7. The memory device of claim 1, wherein the control logic is to perform operations further comprising:
tracking statuses of the first number of planes of the memory array and the second number of independent plane driver circuits; and
routing memory access operations in the memory device based on the statuses.

8. A method comprising:
receiving a first memory command directed to a first plane of a first number of planes of a memory device;
configuring a plane selection circuit to couple a first independent plane driver circuit of a second number of independent plane driver circuits to the first plane of the first number of planes, wherein the second number is less than the first number;
causing the first independent plane driver circuit to perform a first memory operation corresponding to the first memory command on the first plane;
receiving a second memory command while the first memory operation is still being performed;
determining whether the second memory command is directed to a same plane as the first memory command;
responsive to determining that the second memory command is not directed to the same plane as the first memory command, configuring the plane selection circuit to couple a second independent plane driver circuit of the second number of independent plane driver circuits to a second plane if the first number of planes; and
causing the second independent plane driver to perform a second memory operation corresponding to the second memory command on the second plane concurrently with the first memory operation being performed on the first plane.

9. The method of claim 8, wherein the second number of independent plane driver circuits are configured to concurrently provide signals to access blocks of the first number of planes during memory access operations.

10. The method of claim 8, wherein the plane selection circuit comprises a first number of multiplexer circuits, each corresponding to one of the first number of planes.

11. The method of claim 10, wherein each of the first number of multiplexer circuits is configured to route signals from any of the second number of independent plane driver circuits to the corresponding one of the first number of planes based on a received control signal.

12. The method of claim 8, further comprising:
responsive to determining that the second memory command is directed to the same plane as the first memory command, maintaining an indication of the second memory command in a queue corresponding to the first plane until the first memory operation is complete.

13. The method of claim 12, further comprising:
causing the first independent plane driver circuit to perform a second memory operation corresponding to the second memory command on the first plane.

14. The method of claim 8, further comprising:
tracking statuses of the first number of planes of the memory device and the second number of independent plane driver circuits; and
routing memory access operations in the memory device based on the statuses.

15. A non-transitory computer-readable storage medium storing instructions, which when executed by a processing device, cause the processing device to perform operations comprising:
receiving a first memory command directed to a first plane of a first number of planes of a memory device;
configuring a plane selection circuit to couple a first independent plane driver circuit of a second number of independent plane driver circuits to the first plane of the first number of planes, wherein the second number is less than the first number;
causing the first independent plane driver circuit to perform a first memory operation corresponding to the first memory command on the first plane;
receiving a second memory command while the first memory operation is still being performed;
determining whether the second memory command is directed to a same plane as the first memory command;
responsive to determining that the second memory command is not directed to the same plane as the first memory command, configuring the plane selection circuit to couple a second independent plane driver circuit of the second number of independent plane driver circuits to a second plane if the first number of planes; and
causing the second independent plane driver to perform a second memory operation corresponding to the second memory command on the second plane concurrently with the first memory operation being performed on the first plane.

16. The non-transitory computer-readable storage medium of claim 15, wherein the second number of independent plane driver circuits are configured to concurrently provide signals to access blocks of the first number of planes during memory access operations.

17. The non-transitory computer-readable storage medium of claim 15, wherein the plane selection circuit comprises a first number of multiplexer circuits, each corresponding to one of the first number of planes.

18. The non-transitory computer-readable storage medium of claim 17, wherein each of the first number of multiplexer circuits is configured to route signals from any of the second number of independent plane driver circuits to the corresponding one of the first number of planes based on a received control signal.

19. The non-transitory computer-readable storage medium of claim 15, wherein the instructions cause the processing device to perform operations further comprising:
responsive to determining that the second memory command is directed to the same plane as the first memory command, maintaining an indication of the second memory command in a queue corresponding to the first plane until the first memory operation is complete.

20. The non-transitory computer-readable storage medium of claim 19, wherein the instructions cause the processing device to perform operations further comprising:
causing the first independent plane driver circuit to perform a second memory operation corresponding to the second memory command on the first plane.

\* \* \* \* \*